(12) United States Patent
Maletsky

(10) Patent No.: US 6,792,065 B2
(45) Date of Patent: Sep. 14, 2004

(54) METHOD FOR COUNTING BEYOND ENDURANCE LIMITATIONS OF NON-VOLATILE MEMORIES

(75) Inventor: Kerry D. Maletsky, Monument, CO (US)

(73) Assignee: Atmel Corporation, San Jose, CA (US)

( * ) Notice: Subject to any disclaimer, the term of this patent is extended or adjusted under 35 U.S.C. 154(b) by 68 days.

(21) Appl. No.: 10/348,782

(22) Filed: Jan. 21, 2003

(65) Prior Publication Data

US 2004/0141580 A1 Jul. 22, 2004

(51) Int. Cl.$^7$ .............................................. H03K 21/00
(52) U.S. Cl. ............................ 377/34; 377/26; 377/28
(58) Field of Search ............................... 377/34, 26, 28

(56) References Cited

U.S. PATENT DOCUMENTS

| | | | |
|---|---|---|---|
| 4,947,410 A | 8/1990 | Lippmann et al. | ............ 377/26 |
| 6,084,935 A | 7/2000 | Mather | ........................ 377/33 |
| 6,249,562 B1 * | 6/2001 | Wells | ........................... 377/26 |

* cited by examiner

Primary Examiner—Margaret R. Wambach
(74) Attorney, Agent, or Firm—Thomas Schneck

(57) ABSTRACT

A digital counter that uses non-volatile memories as storage cells, wherein the storage cells are sub-divided into two groups, one for the implementation of a rotary counter that keeps track of the less significant part of the count and a binary counter that keeps track of the more significant part of the count. The rotary counter implements a counting method that maximizes the count that can be obtained before the endurance limit of the memory is reached by making sure that each change of state of each cell is recorded as one count and that all cells in the rotary counter experience two change of state in every cycle. The binary counter records the number of cycles the rotary counter has gone through.

16 Claims, 3 Drawing Sheets

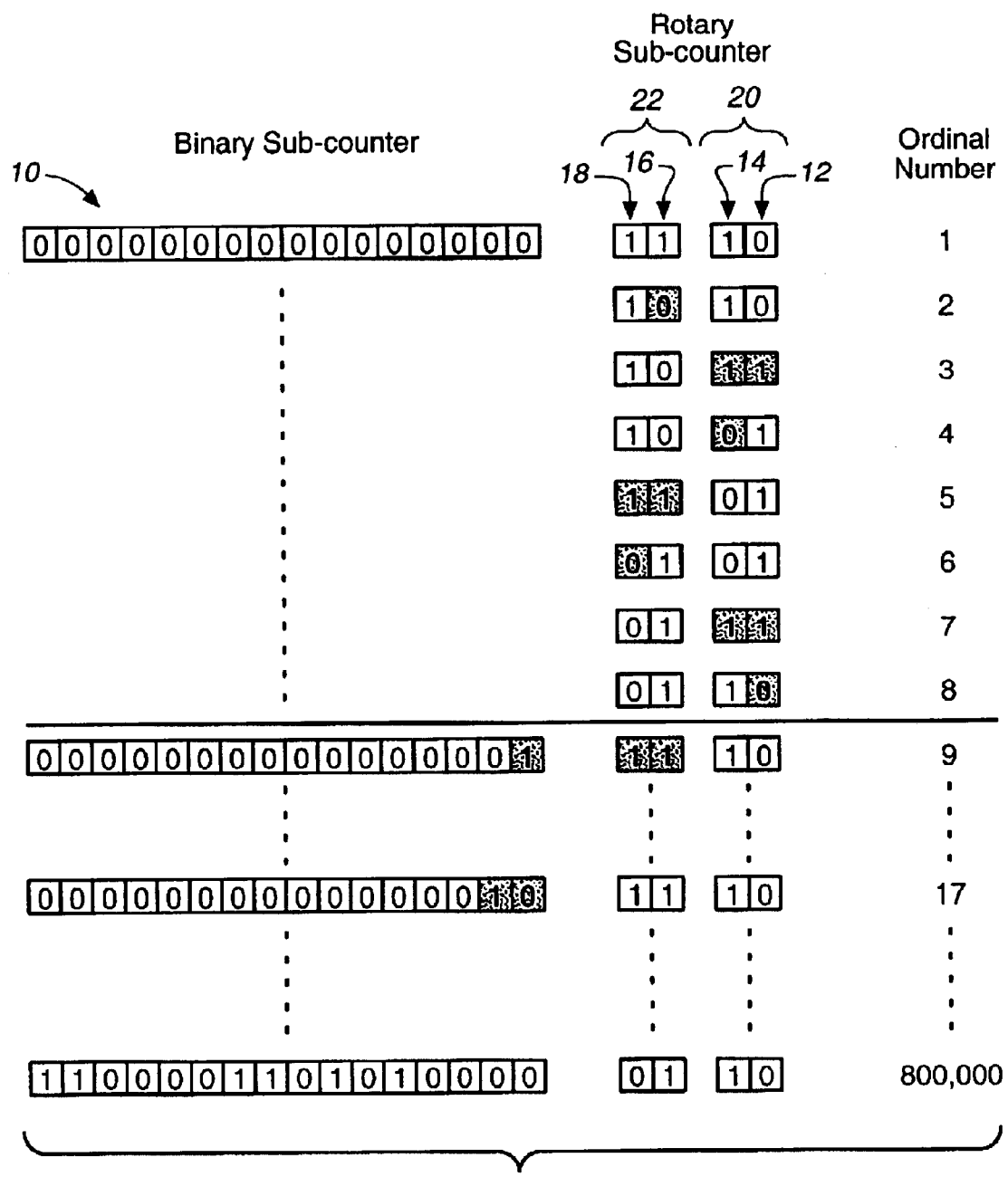
FIG._1

FIG._2

| 46 | 44 | 42 | 40 | Ordinal Number |
|---|---|---|---|---|
| 111 | 111 | 111 | 110 | 1 |
| 111 | 111 | 110 | 110 | 2 |
| 111 | 111 | 110 | ▒▒▒ | 3 |
| 111 | 110 | 110 | 111 | 4 |
| 111 | 110 | ▒▒▒ | 111 | 5 |
| 110 | 110 | 111 | 111 | 6 |
| 110 | ▒▒▒ | 111 | 111 | 7 |
| 110 | 111 | 111 | 101 | 8 |
| ▒▒▒ | 111 | 111 | 101 | 9 |
| 111 | 111 | 101 | 101 | 10 |
| 111 | 111 | 101 | ▒▒▒ | 11 |
| 111 | 101 | 101 | 111 | 12 |
| 111 | 101 | ▒▒▒ | 111 | 13 |
| 101 | 101 | 111 | 111 | 14 |
| 101 | ▒▒▒ | 111 | 111 | 15 |
| 101 | 111 | 111 | 011 | 16 |
| ▒▒▒ | 111 | 111 | 011 | 17 |
| 111 | 111 | 011 | 011 | 18 |
| 111 | 111 | 011 | ▒▒▒ | 19 |
| 111 | 011 | 011 | 111 | 20 |
| 111 | 011 | ▒▒▒ | 111 | 21 |
| 011 | 011 | 111 | 111 | 22 |
| 011 | ▒▒▒ | 111 | 111 | 23 |
| 011 | 111 | 111 | 110 | 24 |
| ▒▒▒ | 111 | 111 | 110 | 1 |

FIG._3

METHOD FOR COUNTING BEYOND ENDURANCE LIMITATIONS OF NON-VOLATILE MEMORIES

FIELD OF THE INVENTION

The present invention relates generally to digital counters and methods of counting, especially as implemented in those digital counters that use non-volatile memory.

BACKGROUND ART

Digital counters that retain their count for extended period of time without the need for uninterrupted power supplies are indispensable parts of modern electronics. Some typical examples of these applications are digital automotive odometers, digital usage meters for commercial appliances, and cryptographic systems that require a unique numerical tab for each transaction to prevent fraudulent system access. Non-volatile memories such as EEPROM and Flash memory, being able to store information permanently without needing any additional electrical power, should be well suited to such applications.

However, there are limitations associated with the use of non-volatile memories for counting applications. EEPROM and Flash memories are programmed and erased by injecting electrons into and discharging electrons from floating gates, which are semiconductor structures that are typically made of polysilicon. Repeated programming and erasure of a floating gate can cause charge to be trapped in the polysilicon permanently, resulting in a drift in threshold voltage over time. Eventually, these trapped electrons will prevent further reprogramming, inducing device malfunction. The maximum number of cycles a memory cell can endure before programming error is expected is commonly called the endurance cycle rating. This endurance cycle rating is typically derived through extensive characterization and qualification processes. A single programming step followed by a single erasure step constitutes a single endurance cycle. Current non-volatile memory design and fabrication technology produce EEPROM and Flash memories that have endurance cycle rating of between ten thousand to one million. In typical EEPROM implementations, writing to a group of bits may cause multiple bits within the group to "expand" an endurance cycle even if their state does not change. This is because typical implementations may reset the entire group and then only set those that should set in the final state.

To facilitate description and explanation of various counting methods, we will, hereafter, adopt the following convention for memory programming and erasure: programming denotes the injection of electrons into the floating gates while erasure denotes the discharge of electrons from the floating gates. When binary representation is used, the programmed state is represented by the binary number "0" while the erased state will be represented by the binary number "1". When a memory cell changes state from a 1 to a 0, it will hereafter be called the setting of the cell. When a memory cell changes state from a 0 to a 1, it will hereafter be called the resetting of the cell.

Because of the limitation imposed by the endurance cycles, anytime EEPROM or flash memory cells are employed as counting bits for digital counters, one must take the endurance of the memory used into account. For instance, in a typical binary counter, the least significant bit (LSB) switches from 0 to 1 or 1 to 0 for each count, the second LSB changes state every time the LSB switches from 1 to 0, the third LSB changes state every time the second LSB changes from 1 to 0 and so on. Since the LSB in a binary counter is one that changes state most, it is also the one that will usually fail first. Assuming that the EEPROM cells used for such application have an endurance cycle rating of one hundred thousand cycles, such a counter can only be expected to have a maximum count limit of about two hundred thousand, after which a counting error can be expected to occur due to programming failure of the LSB. Alternatively, the most significant bits of a binary counter may fail due to their having been repeatedly set to a zero.

Obviously, the ordinary binary counting method is not an optimal way to maximize the endurance cycles of a given EEPROM counter since for a given string of bits, the least significant bit exhausts its endurance cycles long before other bits, rendering the counter useless even though most of the bits still have plenty of endurance cycles left. To maximize the count of a given number of EEPROM cells, or to minimize the number of EEPROM cells required for a desired maximum count, one may devise a counting method that spreads out the programming cycle more evenly among all EEPROM cells. For example, counting with a Gray code number representation typically doubles the life of a counter over that of counting with the usual binary number representations.

U.S. Pat. No. 4,947,410 to Lippmann et al. entitled "Method and Apparatus for Counting with Nonvolatile Memory" and U.S. Pat. No. 6,249,562 to Wells, entitled "Method and System for Implementing a Digital Counter Optimized for Flash Memory" are typical examples of such counting methods. However, the counting methods described in the above mentioned patents require that the memories used be individually bit programmable and individually bit erasable. In other words, these methods are not applicable to an EEPROM that does not support individual bit erasure. Since most standard product EEPROM memories, such as serial EEPROM, do not support individual bit erasure, it would be desirable to have a counting method that is applicable to such memories.

Another limitation associated with the above mentioned counting methods lies in the fact that they typically require a duplicate counter to be running in parallel in order for it to recover from programming failure. It would be desirable to have a counting method that allows for recovery without the need of a redundant circuit.

SUMMARY OF THE INVENTION

It is therefore an objective of the present invention to provide a non-volatile memory based digital counter that can maximize the total count of a given counter size, considering failure possibilities, or by minimizing the number of memory cells required to reach a certain maximum count. It is another objective of the present invention to provide a counting method that can be applied to those non-volatile memories that do not support single bit erasure. It is also an objective of the present invention to provide a method of counting that enables recovery caused by write/erase failure without the need of a redundant circuit.

The present invention is a non-volatile memory based digital counter that maximizes the counting capacity of a given number of memory cells by evenly distributing the counting load among every cell and by making sure that every single change of state in every cell amounts to one count. The counter of the present invention is composed of two sub-counters: a main sub-counter, which can be an ordinary binary counter, Gray code counter or binary-codeddecimal counter operating in the usual way, and that keeps track of the more significant portion of the count, a rotary sub-counter that keeps track of the less significant portion of the count. In the rotary sub-counter, each rotation involves one setting and one resetting of all cells in the counter, with each set and each reset of a cell amounting to a single count. Such a rotary sub-counter with K number of cells will provide a total count of 2K per rotation.

The rotary sub-counter follows a pattern of changing states outlined as follow: with the cells in the rotary counter organized into groups of equal number of cells having a 1 state, the first ordinal number is represented by having the state in a first cell of a first group set to a 0 state. A subsequent set of ordinal numbers is represented by successively setting similarly positioned cells in the remaining groups of cells. A next set of ordinal numbers is being represented by resetting all but the cell in the last group back to 1s. The next two ordinal numbers are being represented by first setting a second cell in the first group to a 0 and then resetting the last cell in the previous group back to all 1s. The remainder of the ordinal numbers in the rotary set is represented by simply repeating the same pattern of cell set and reset as prescribed above until every cell in the rotary sub-counter has gone through exactly one cycle of set and reset, at which point the binary sub-counter records one count and the rotary sub-counter starts all over again, beginning with the first ordinal number being represented by the first cell pattern as described above. Because each cell gets the same number of sets and resets, the wear on the overall rotary counter is uniform.

BRIEF DESCRIPTION OF DRAWINGS

FIG. 1 is a set of tables showing how a 4-cell rotary sub-counter represents 8 ordinal numbers and how a 16 cell binary sub-counter and a 4-cell rotary sub-counter work together to generate a maximum count of 800,000.

FIG. 2 is a set of tables showing the sequence of setting and resetting cells in a 24-cell rotary sub-counter to represent 48 ordinal numbers.

FIG. 3 is a set of tables showing an alternating sequence of setting and resetting cells in a 12-cell rotary sub-counter implementing an alternate embodiment of the invention.

DETAILED DESCRIPTION OF PREFERRED EMBODIMENTS

In FIG. 1, a rotary sub-counter that is made up of four cells 12, 14, 16, and 18 is shown alongside a binary sub-counter 10 with sixteen cells. The cells in rotary sub-counter go through eight bit pattern changes in each rotary cycle, with each pattern representing one of eight ordinal numbers. Each consecutive pattern change involves the change of state in no more than one cell. The cells in the rotary sub-counter are organized into a first and a second group 20 and 22 with a first cell 12, 16 and a second cell 14, 18 in each group. Ordinal number 1 is being represented by having a 1 state in all but the first cell 12 in the first group 20, where the cell is in a 0 state. Ordinal number 2 is being represented by copying the cell pattern in the first group 20 to the second group 22, thereby setting the first cell 16 in the second group 22 to a 0 state. The first cell 16 in second group 22 is darkened to indicate the change of state in that particular cell. Ordinal number 3 is being represented by resetting the 0 in the first cell 12 of the first group 20 back to a 1. For those non-volatile memories that do not allow individual cell erasure (resetting), the first cell 12 in the first group 20 can be reset by resetting the whole group, as it is indicated by the darkening of the whole of first group 20. Since the rest of cells in the first group is in a 1 state already, no addition endurance cycle penalty is incurred by this group-wise resetting step.

Ordinal number 4 is being represented by setting the 1 state in the second cell 14 of the first group 20 to a 0 state. Ordinal number 5 is being represented by resetting all cells in the second group 22 back to 1s. Ordinal number 6 is being represented by copying the cell state pattern in the first group 20 to the second group 22, thereby setting the second cell in the second group to a 0 state. Ordinal number 7 is being represented by resetting the cells in the first group 20 back to 1s and ordinal number a is being represented by setting the first cell 12 in the first group 20 to a 0 state. At this point, all permutations allowed under the counting method of the present invention using 4 cells has been exhausted and so the binary counter 10 recorded a 1 count. The next ordinal number, number 9, is being represented by a 1 in the binary sub-counter and a 1110 in the rotary sub-counter. By the same token, ordinal number 17 is being represented by a 10 in the binary sub-counter and a 1110 in the rotary sub-counter. Assuming that the memory cells employed in this counter have an endurance rating of 100,000 cycles and that each cycle involves a set and a reset of a memory cell, then the maximum count for this counter would be 800,000 (100K×2×4). Each additional cell added to the rotary sub-counter would add 200K to the maximum possible count.

In addition to the previous mentioned advantages, the present invention enables recovery of count due to power loss during a write operation without the need of a redundant circuit. If this power failure happens, then the next time the system looks at the counter value, it determines if there was an interrupted write and fixes that problem before permitting a subsequent count event. All the counter has to do to recover is to locate the sample group and copy the state pattern in the sample group onto faulty group. The reason for that is there is always at least one group of cells in the rotary sub-counter that retains the 0 state position for that rotation. The general outline of the error recovery procedure is to isolate the byte in error, then to find the places in the counting sequence where that byte has been written, and set to one of the adjacent bytes (in the sequence) to match the state in the system. If an error recovery procedure is performed, the final value will be that before the interrupted count is started or what the count would have been had the count completed, depending on how far the write had progressed when the power failed.

In a preferred embodiment of the present invention, the cells in the rotary sub-counter are organized into byte size group as it is shown in FIG. 2. For simplicity, we will illustrate the counting of the rotary counter using three bytes only. However, once the counting method is described, a person can easily scale up the counting method to accommodate as many bytes as desired for an application.

The rotary sub-counter shown in FIG. 2 has 24 cells that are organized into three byte-wide groups of cells, including a first byte 30, a second byte 32 and a third byte 34 of cells. With 24 cells, 48 ordinal numbers are represented per rotary cycle. Assuming an endurance of 100K cycles for each cell, the maximum count possible for this counter is 4.8 million. The first ordinal number is again represented by having the rightmost cell in the first byte 30 in the 0 state while the rest of the cells in the rotary sub-counter are in the 1 state. The second and third ordinal numbers are represented by successively setting the rightmost cells in the respective bytes 32 and 34 to a 0 state, thereby copying the pattern in the first byte into each of the other bytes in turn. The fourth and fifth ordinal numbers are represented by successively resetting the first and second bytes 30 and 32, to all ones, thereby leaving only the third (last) byte 34 with a different pattern. The next two (sixth and seventh) ordinal numbers are represented by setting the second rightmost cell in the first byte 30 to a 0 state, then resetting the third byte 34 back to all ones. The following ordinals are then successively represented by copying the new pattern in the first byte onto each of the other bytes (including the third or last byte), then successively resetting all but the last byte back to all ones, then setting a new pattern in the first byte 30 having a single bit with a zero state, resetting the last byte to all ones, and repeating the sequence. This process continues in similar fashion until every cell or bit in every byte has gone through exactly one endurance (one set and one reset) cycle.

The designation of specific bytes as first byte, second byte, etc., to the last byte is arbitrary, that is the byte sequence for setting and resetting can be any arbitrary order. Indeed, the setting and resetting order can even differ provided the first and last bytes are the same in both. Likewise, the designation of which bit within any byte is the first, second, etc., to be set to zero is arbitrary and can be done in any designated order, provided it is consistent throughout the entire rotary cycle. In an actual implementation of this counter method, either using software routine or hardware wiring, the order of setting and resetting in the count could be decided arbitrarily during the coding and design phase.

The number n of cells or bits in the rotary counter can vary from one implementation to another, depending on the desired endurance enhancement. The cells should be evenly divisible into two or more equal-size groups of two or more cells. The number of ordinals in the rotary cycle is always 2·n.

Although the examples above show the functioning of the counter by means of shifting a 0 state through the cells of 1 states in each byte, given a different nomenclature convention, it can easily be described as having a 1 state shifting through cells of 0 state in each byte. One important aspect of the present invention lies in the fact that there is only one cell change per count. Another aspect of the present invention lies in the fact that the step of resetting a cell can be implemented by resetting the whole byte without any penalty on the endurance cycle. Yet another aspect of the present invention lies in the fact that in every ordinal representation, there exist at least one byte that keeps track of the 0 state position within that rotation. As a result, counting error due to programming failure on a single byte can be corrected by locating the byte with the correct sequence and copy that sequence onto the failed byte.

Also, while the examples given above segregate the sequence of steps copying a bit pattern of a first group onto each of the other groups from the sequence of steps resetting those groups, with the exception that a new bit pattern on the first group is established before resetting the last group, one can also construct a cycle in which copying and resetting are interleaved. That is, a sequence could be defined in which a first bit pattern is established in a first group, that pattern is copied to a second group, the first group is reset, the pattern is copied to a third group, the second group is reset, etc., until the pattern is copied to a last group, the next-to-last group is reset, a second bit pattern is established in the first group, the last group is reset, the copying and resetting sequence is continued using the second pattern, etc., until every bit in the rotary counter has been set and reset once. Again, each bit pattern in a group is characterized by a zero in only one bit or cell for the group. As before, each bit in such group changes from 1 to 0 and back only once per cycle.

For example, in FIG. 3, 12 cells are organized into four 3-bit groups 40, 42, 44, and 46. A first ordinal number is again represented by having the rightmost cell in a first group 40 in the 0 state while the rest of the cells are in the 1 state. Second and third ordinal numbers are represented by successively setting the rightmost cell in a second group 42 and then resetting all cells in the first group 40. The same setting and resetting pattern is repeated for a third group 44 and a fourth group 46 of cells, with each set/reset representing a new ordinal number. Once the rightmost cell in the last (fourth) group 46 is set, followed by a reset of all cells in the third group, the next ordinal number, number 8 in this example, is represented by setting a second cell in the first group. This process continues in such alternatively setting and resetting sequence until every cell in every group has gone through exactly one endurance cycle.

In all of these examples, the binary sub-counter works as usual, but because it only keeps track of the more significant bits of the count, its endurance is extended by a factor of 2·n, where n is the bit size of the rotary sub-counter. The binary sub-counter only changes state after each complete rotary count cycle. Any known counting method can be used for the binary sub-counter. In addition to ordinary binary counters, other counters such as Gray code counters, binary-coded-decimal counters, linear feedback shift register counters, and many more would be used.

A digital counter described above is well suited for implementating a cryptographic processing module in a security chip. Such cryptographic systems require a unique tag be given to every transaction in order to prevent various kinds of replay attacks (where 'old' information may be re-used fraudulently). The non-volatile digital counter of the present invention can be used to tag individual cryptographic transactions. For instance, to implement a system that needs to provide a count once per second for seven years without interruption, the counter must be able to count up to about 220 million (or somewhat less than $2^{28}$). Assuming that the non-volatile memory used is characterized and qualified at an endurance of one hundred thousand programming cycles, then, a 16-bit binary sub-counter is needed to keep track of a maximum of one hundred thousand endurance cycles and a rotary sub-counter with 1100 bits is require to represent 2200 ordinal numbers. For implementation of such counter using byte-wise memory system, 138 bytes of non-volatile memories would be needed for the rotary sub-counter. There are of course other uses for these types of monotonic counters in cryptographic systems. For example, they can be used to limit the number of transactions that are performed using a given resource. They can also be used to form a stream of unique initialization vectors for various algorithms.

What is claimed is:

1. A method of counting using a digital counter that uses non-volatile memories as storage cells, each said cell capable of storing either a first state or a second state, comprising the steps of:
   a) organizing the cells into two groups, a more significant group (MSG) with J cells that function as a counter and a less significant group (LSG) with K cells that function as a rotary counter, with J being any integer greater than one and K being any integer greater than three;
   b) organizing the LSG into L subgroups with M cells in each subgroup, where M being any integer greater than one and M multiplied by L being equal to K, wherein every cell in every LSG subgroup is in the first state;
   c) representing A first ordinal number by having a first cell in a first LSG subgroup set to a second state;

d) representing a subsequent set of ordinal numbers by successively setting a first cell in each remaining LSG subgroups to the second state;

e) representing a next set of ordinal numbers by successively resetting the second state in the first cell of first LSG subgroup back to the first state and continue resetting with all remaining LSG subgroups except the Lth LSG subgroup;

f) representing next two ordinal numbers by sequentially setting a second bit in the first LBG group to the second state and resetting the first cell in the Lth LSG subgroup back to the first state;

g) representing subsequent ordinal numbers by repeating the above described pattern of setting and resetting of a particular cell in each LSG subgroup until every cell in each LSG subgroup has been set and reset exactly once; and h) incrementing the more significant group (MSG) of J cells by one while the less significant group (LSG) of K cells starts over again, beginning with the first ordinal number as described in step c.

2. The counting method of claim 1, wherein M is equal to a multiple of 8.

3. The counting method of claim 1, wherein the step of setting the second cell in the first LSG subgroup to the second state is carried out subsequent to the step of resetting the first LSG subgroup but before the resetting of the Lth LSG subgroup.

4. The counting method of claim 1, wherein a maximum count is reached when every cell in every LSG subgroup has gone through a same number of set-reset cycles that is equal to an endurance cycle limit that is characteristic of the non-volatile memory cells in use.

5. The counting method of claim 4, wherein the value J is large enough to allow binary counting of up to the endurance cycle limit.

6. The counting method of claim 1, wherein the non-volatile memories allow the setting of individual cell from the first state to the second state but resetting can only be done with the whole subgroup as a unit.

7. The counting method of claim 1, wherein the method of counting is encoded in a software program.

8. The counting method of claim 1, wherein the method of counting is implemented with logical hardware components.

9. A method of counting using a digital counter that uses non-volatile memories as storage cells, each cell capable of storing either a first state or a second state, comprising steps of:

a) organizing the cells into two groups, a more significant group (MSG) with J cells that function as a counter and a less significant group (LSG) with K cells that function as a rotary counter, with J being any integer greater than one and K being any integer greater than three;

b) organizing the LSG into L subgroups with M cells in each LSG subgroup, where M being any integer greater than one and M multiplied by L being equal to K, wherein every cell in every LSG subgroup is in the first state;

c) representing a first ordinal number by having a first cell in a first LSG subgroup set to a second state;

d) representing subsequent ordinal numbers by successively setting a first cell in a next LSG subgroup to the second state followed by resetting all cells in a preceding LSG subgroup to the first state;

e) once a first cell in a last LSG subgroup is set to a second state, and cells in a second to last LSG subgroup are reset, representing the next two ordinal numbers by successively setting a second cell in the first LSG subgroup to a second state and resetting all cells in the last LSG subgroup;

f) representing subsequent ordinal numbers by repeating the above described pattern of setting and resetting of a particular cell in each LSG subgroup until every cell in each LSG subgroup has been set and reset exactly once; and g) incrementing the more significant group (MSG) of J cells by one while the less significant group (LSG) of K cells starts over again, beginning with the first ordinal number as described in step c.

10. The counting method of claim 9, wherein M is equal to a multiple of 8.

11. The counting method of claim 9, wherein the step of setting the second cell in the first LSG subgroup to the second state is carried out subsequent to the step of resetting the first LSG subgroup but before the resetting of the last LSG subgroup.

12. The counting method of claim 9, wherein a maximum count is reach when every cell in every LSG subgroup has gone through a same number of set-reset cycles that is equal to an endurance cycle limit that is characteristic of the non-volatile memory cells in use.

13. The counting method of claim 12, wherein the value J is large enough to allow binary counting of up to the endurance cycle limit.

14. The counting method of claim 9, wherein the non-volatile memories allow the setting of individual cell to from the first state to the second state but resetting can only be done with the whole subgroup as a unit.

15. The counting method of claim 9, wherein the method of counting is encoded in a software program.

16. The counting method of claim 9, wherein the method of counting is implemented with logical hardware components.

* * * * *

UNITED STATES PATENT AND TRADEMARK OFFICE
CERTIFICATE OF CORRECTION

| | |
|---|---|
| PATENT NO. | : 6,792,065 B2 |
| APPLICATION NO. | : 10/348782 |
| DATED | : September 14, 2004 |
| INVENTOR(S) | : Kerry D. Maletsky |

It is certified that error appears in the above-identified patent and that said Letters Patent is hereby corrected as shown below:

Column 4, line 13: "... and ordinal number a is being represented by ..." should read:

-- ... and ordinal number 8 is being represented by... --.

Signed and Sealed this

Twenty-sixth Day of December, 2006

JON W. DUDAS
*Director of the United States Patent and Trademark Office*